(12) United States Patent
Tanabe

(10) Patent No.: US 6,379,999 B1
(45) Date of Patent: Apr. 30, 2002

(54) SEMICONDUCTOR DEVICE AND METHOD OF MANUFACTURING THE SAME

(75) Inventor: Shinji Tanabe, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/525,517

(22) Filed: Mar. 15, 2000

(30) Foreign Application Priority Data

Sep. 10, 1999 (JP) .......................................... 11-257209

(51) Int. Cl.⁷ ............................................... H01L 21/44
(52) U.S. Cl. ..................... 438/113; 438/114; 438/458; 257/684
(58) Field of Search ................................ 438/113, 114, 438/458, 106, 199, 202, 234, 460, 462, 110, 465, 617, 112, 124, 127, 122, 459, 455, 424; 257/684, 118, 513; 216/17, 52, 65–67

(56) References Cited

U.S. PATENT DOCUMENTS

| 5,202,754 | A | | 4/1993 | Bertin et al. ................. 257/684 |
| 5,646,067 | A | * | 7/1997 | Gaul ........................... 438/458 |
| 5,879,964 | A | * | 3/1999 | Paik et al. .................... 438/113 |
| 6,020,217 | A | * | 2/2000 | Kuise et al. ................... 438/106 |
| 6,080,603 | A | * | 6/2000 | Distefano et al. ............ 438/117 |
| 6,107,164 | A | * | 8/2000 | Ohuchi ........................ 438/465 |
| 6,117,347 | A | * | 9/2000 | Ishida .......................... 216/52 |
| 6,117,704 | A | * | 9/2000 | Yamaguchi et al. ......... 438/100 |
| 6,153,448 | A | * | 11/2000 | Takahashi et al. ........... 438/114 |
| 6,197,616 | B1 | * | 3/2001 | Hyoudo et al. .............. 438/113 |
| 6,207,477 | B1 | * | 3/2001 | Motooka et al. ............ 438/113 |
| 6,221,751 | B1 | * | 4/2001 | Chen et al. .................. 438/612 |
| 6,245,596 | B1 | * | 6/2001 | Kosaki et al. ............... 438/114 |
| 6,245,646 | B1 | * | 6/2001 | Roberts ....................... 438/464 |

* cited by examiner

*Primary Examiner*—Matthew Smith
*Assistant Examiner*—Chuong A Luu
(74) *Attorney, Agent, or Firm*—Rabin & Berdo, P.C.

(57) ABSTRACT

A method of manufacturing a semiconductor device in which potential can be applied well to a substrate without the semiconductor device being made less compact. A wafer 11A includes a semiconductor layer 13, a surface oxide film 14 and electrode pads 16 for the substrate. The semiconductor layer 13 is formed on the wafer 11A via an insulating layer 12, and a plurality of same semiconductor circuits are formed collectively at the semiconductor layer 13. The surface oxide film 14 covers the semiconductor layer 13. The electrode pads 16 for the substrate are formed on the surface oxide film 14 in correspondence with the semiconductor circuits. Cut grooves 18 for separating the wafer 11A into chips 10 of the semiconductor circuits are formed in the wafer 11A from the surface oxide film 14 to the substrate. Before the wafer 11A is separated into the chips 10, a conductive layer 17 is formed. The conductive layer 17 is formed from a substrate region 11 of cut groove surfaces 18a and 18b, via the cut groove surfaces 18a and 18b, and reaches the electrode pads 16.

4 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and in particular, to a semiconductor device which is suited to an SOI structure and a method of manufacturing the same.

2. Description of the Related Art

One technique of manufacturing a semiconductor is the SOI (Semiconductor-On-Insulator) technique which is as follows. An insulating film (such as a silicon oxide film) which serves as a buffer layer is grown on an insulating substrate of silicon oxide or sapphire or the like. Thereafter, a semiconductor thin film is formed on the insulating film. For example, a unipolar transistor element such as a MOS transistor, or a bipolar transistor element is built-in in this semiconductor thin film. In a semiconductor device such as a semiconductor integrated circuit (IC) having an SOI structure formed by this SOI technique, the junction capacitance is lower than that of a semiconductor device formed at a bulk semiconductor. Thus, a semiconductor device having an SOI structure has advantages such as the operational speed of the semiconductor device is improved.

In such an IC, generally, a large number of the same IC portions are formed collectively on a substrate wafer. Pads, which are the connection terminals to the respective internal circuits, are formed on the surface of the substrate wafer for the respective IC portions. The IC portions of the substrate wafer are cut out and separated as chips by, for example, cleavage using scribe lines. In this way, the individual IC chips are formed.

The IC chips are packaged in order to facilitate handling thereof at the time the IC chip is assembled with a circuit board or the like. In a chip scale package (CSP), a package plate is used which is formed from an insulating plate made of, for example, polyimide, at which connection terminals corresponding to the respective pads are provided. In a CSP, before the wafer is separated into the IC chips, the surfaces of the IC chips are covered by the package plate so that the pads for the internal circuits provided at the wafer surface abut the connection terminals corresponding to the package plate.

Potential is applied to the IC substrate in order to ensure stable operation of the IC chip. In order to apply potential to the IC substrate, the following has been proposed. Pads for electrical connection to the IC substrate are provided on the IC chip surface opposing the package plate. (Hereinafter, these pads will be referred to as "pads for the substrate".) Embedded plug portions, which extend from the pads through the interior of the IC chip toward the substrate, are formed.

In this way, conductive portions, which extend from the IC substrate to the pads for the substrate provided at the IC surface, are formed as embedded plug portions which extend through the interior of the IC chip. Thus, potential can be applied to the IC substrate from the IC chip surface which is at the same side at which the package plate is positioned and other pads for the internal circuit are provided, without leading to a substantial increase in the surface area required for the IC chip, i.e., without making the IC chip less compact.

However, in the above-described conventional structure, a special additional processing is required in order to form, by etching and within the main body of the IC chip, the holes for forming the embedded plug portions. Thus, manufacturing becomes complex. Further, the surface area of contact between the substrate and the embedded plug portion, which is embedded in the hole formed by etching, is determined by the hole diameter of the etched hole and the like, and is relatively small. Thus, the conventional structure is not preferable from the standpoint of reliable and stable application of potential.

In addition, the conventional structure affects the chip layout as well, and results in the semiconductor device being less compact.

SUMMARY OF THE INVENTION

An object of the present invention is to provide a semiconductor device which can be manufactured relatively easily and can ensure a stable substrate potential without a loss of compactness of the semiconductor device, and to provide a method of manufacturing the semiconductor device.

In order to achieve the above object, cut grooves are utilized in the present invention. The cut grooves are formed in a substrate wafer, at which semiconductor devices are collectively formed, for separating the substrate wafer into semiconductor chips of the respective semiconductor devices. A conductive layer, which extends to electrode pads for electrical connection to the substrate, is formed in the groove surface of the cut groove.

Namely, a method of manufacturing a semiconductor device according to the present invention includes the steps of: forming cut grooves in a wafer which becomes a substrate, the wafer including a semiconductor layer which is disposed on the wafer via an insulating layer and at which a plurality of same semiconductor circuits are formed collectively, a surface oxide film which covers the semiconductor layer, and electrode pads for electrical contact with the substrate, the electrode pads being formed on the surface oxide film in correspondence with the respective semiconductor circuits, the cut grooves being formed in the wafer from the surface oxide film to the substrate, for separating the wafer into chips of the respective semiconductor circuits; and before separating the wafer into the chips, forming a conductive layer on groove surfaces of the cut grooves, the conductive layer extending from a substrate region via the groove surfaces of the cut grooves to the electrode pads.

In accordance with the method relating to the present invention, the conductive layer, which connects the chip substrate positioned at the reverse surface side of the chip and the electrode pads for the substrate which are positioned at the front surface side of the chip, is not provided within the chip. There is no need to subject the inner portion of the chip to etching in order to form the conductive layer.

The conductive layer is formed at the groove surfaces of the cut grooves by using the cut grooves which are provided in order to separate the chips. Thus, no bonding wire projects outwardly of the IC chip to a great extent, as in the case in which bonding wires are used, and therefore, the dimensions of the IC chip do not substantially increase. Accordingly, the IC chip can be made compact.

Further, the conductive layer which connects the substrate and the electrode pads for the substrate is connected to the substrate at the peripheral side surface of the substrate. Therefore, as compared to a conventional method using embedded plug portions, the electrode pads can be connected to the substrate over a wider connection surface area. Thus, a desired potential can be stably and reliably applied to the substrate.

The cut grooves may be grid lines disposed in a lattice configuration on the substrate wafer for separating the wafer into the respective chips. Further, the conductive layer may be formed by heating after a paste-like conductive material which hardens by heating, e.g., solder paste or silver paste, is applied to predetermined places including the groove surfaces of the cut grooves.

In the method of manufacturing a semiconductor device according to the present invention, preferably, the wafer is formed from silicon oxide, and the silicon oxide, together with the insulating layer and the semiconductor layer, forms an SOI structure. Namely, the method of the present invention is suitable for manufacturing SOI devices. However, instead, the present invention may be applied to a CMOS-LSI having a wafer portion which is electrically isolated from the substrate via an insulating layer. Or, the present invention may be applied to an LSI which is electrically isolated from the substrate by a dielectric.

The semiconductor device relating to the present invention includes a substrate; a semiconductor layer which is disposed on said substrate via an insulating layer, and in which a semiconductor circuit is built in; a surface oxide film covering said semiconductor layer; an electrode pad which is provided on said surface oxide film and which is for electrical contact with said substrate; and a conductive layer for electrically connecting said electrode pad and said substrate, wherein said conductive layer surrounds peripheral surfaces of said semiconductor device including side surfaces of said substrate, and surrounds edge portions of said surface oxide film.

The conductive layer is formed so as to surround the side surfaces of the substrate. Thus, in order to connect the electrode pads and the substrate, there is no need to use a bonding wire which protrudes out to a great extent at the outer side of the semiconductor device, and there is no need for conventional conductive plugs which extend through the interior of the IC chip. Due to the conductive layer, the substrate and the electrode pads formed on the surface oxide film covering the substrate can be suitably connected together.

The conductive layer does not have to be formed continuously along the peripheral direction at the peripheral surfaces of the substrate, and may be formed intermittently along the peripheral direction of the substrate. In this way, portions of the side surfaces of the substrate along the peripheral direction thereof can be exposed from the conductive layer. However, in order to achieve more reliable electrical contact and to also protect the chip by the conductive layer, it is preferable that the conductive layer be formed continuously along the peripheral direction of the semiconductor device at the entire region of the side surfaces of the substrate and at the edge portions of the surface oxide film.

DESCRIPTION OF THE PREFERRED EMBODIMENTS

Hereinafter, an embodiment in which the present invention is applied to the manufacturing of a semiconductor IC chip having an SOI structure will be described in detail with reference to the drawings.

Figure 1:
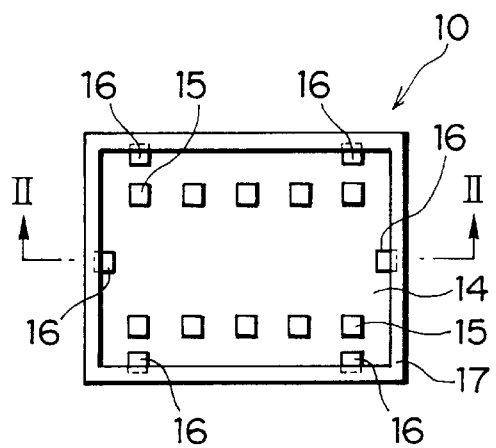
FIG. 1 is a plan view of a semiconductor device relating to the present invention.
Figure 2:
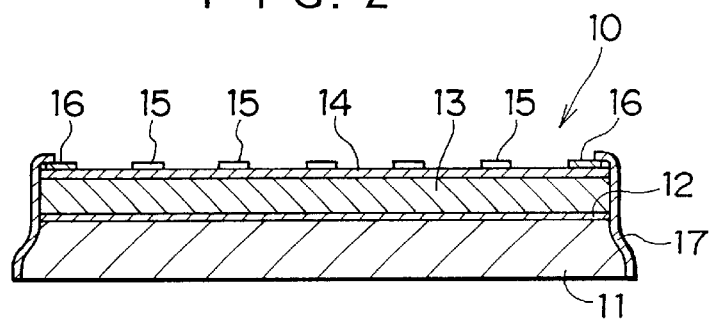
FIG. 2 is a cross-sectional view taken along line II—II of FIG. 1.

FIGS. 1 and 2 are a plan view and a cross-sectional view schematically illustrating a semiconductor chip 10 having an SOI structure relating to the present invention.

In the IC chip 10 having an SOI structure, as illustrated in FIG. 2, for example, an electronic circuit is formed within a silicon semiconductor crystal layer 13 which is layered on a silicon substrate 11 via an insulating layer 12 formed from, for example, silicon oxide. As needed, a conventionally known electronic circuit element (not shown) such as a unipolar transistor element like a MOS transistor, or a bipolar transistor, or the like is built-into the electronic circuit.

The surface of the silicon crystal layer, i.e., the semiconductor layer 13, into which the electronic circuit is built is protected by a surface oxide film 14 which is formed from silicon oxide and covers the entire surface of the semiconductor layer 13. As illustrated in FIG. 1, a plurality of internal electrode pads 15 are arranged at the central portion of the surface oxide film 14, i.e., the portion other than the peripheral portion. Further, a plurality of electrode pads 16 for the substrate are arranged at the peripheral portion of the surface oxide film 14.

The internal electrode pads 15 illustrated in FIG. 2 penetrate through the surface oxide film 14 in the film thickness direction thereof, and, as is conventionally well known, are connected to connection terminals corresponding to the electronic circuit within the silicon crystal layer 13.

The electrode pads 16 for the substrate do not penetrate through the surface oxide film 14, and rather, are supported on the surface oxide film 14. As shown in FIG. 2, a conductive layer 17 is formed at the IC chip 10 from the substrate 11 toward the electrode pads 16 for the substrate, along the side surfaces of the silicon substrate 11.

As shown in FIG. 1, the conductive layer 17 is formed so as to surround the edge portions of the surface oxide film 14, so as to be electrically connected to all of the electrode pads 16 for the substrate on the surface oxide film 14. Further, the conductive layer 17 is formed so as to surround the peripheral side surfaces of the layered body (11, 12, 13, 14) which includes the silicon substrate 11, so as to surround the peripheral sides of the IC chip 10.

The conductive layer 17 is formed from a metal material which is conductive and which hardens when heated, e.g., soldering paste or silver paste, as will be discussed later.

The conductive layer 17 surrounds the silicon crystal layer 13 and the silicon substrate 11, and is connected to the silicon crystal layer 13 and the silicon substrate 11 over a wide surface area of contact. The conductive layer 17 is also connected to the respective electrode pads 16 for the substrate. Thus, the electrode pads 16 for the substrate on the surface oxide film 14 are reliably connected at a relatively low electrical resistance to the silicon crystal layer 13 beneath the surface oxide film 14, and to the silicon substrate 11 beneath the insulating layer 12 which is beneath the silicon crystal layer 13.

Accordingly, by applying a desired potential to the electrode pads 16 for the substrate which are formed on the surface oxide film 14 which is at the surface side of the IC chip 10, the silicon crystal layer 13, and thus the layered body (11, 12, 13 and 14), can be appropriately maintained at a predetermined potential, and the IC chip 10 can thereby be used in a stable operational state.

Further, the conductive layer 17 is formed from a metal material and surrounds the peripheral sides of the IC chip 10. Thus, the overall strength of the IC chip 10 is high, and the durability of the IC chip 10 improves.

At the IC chip 10 relating to the present invention, a predetermined potential can be applied to the silicon substrate 11 from the surface side of the IC chip 10 without forming in the layered body (11, 12, 13, 14) conventional holes formed by etching (hereinafter "etched holes") which extend within the layered body which forms the chip main body. Further, the silicon substrate 11 and the electrode pads 16 for the substrate can be connected compactly by the conductive layer 17 without lead wires, which extend from the silicon substrate 11 of the IC chip 10 to the electrode pads 16 for the substrate provided on the surface of the IC chip 10, being disposed so as to protrude out greatly at the sides of the IC chip 10. Thus, a desired potential can be suitably applied to the silicon substrate 11 without adversely affecting the compactness of the IC chip 10.

The method of manufacturing the IC chip 10 will be described hereinafter with reference to FIGS. 3 through 5.

Figure 3:
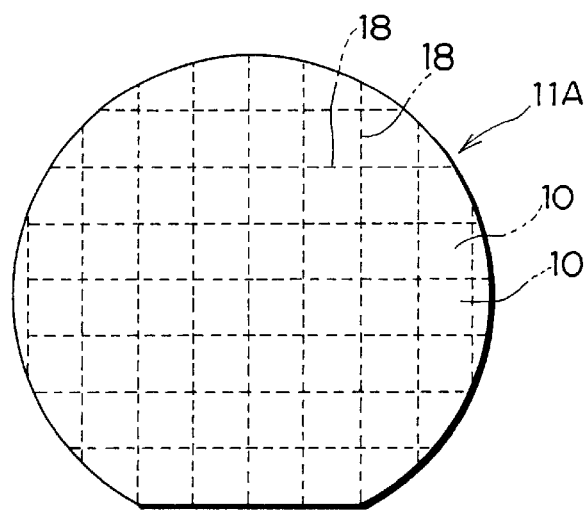
FIG. 3 is a plan view of a substrate wafer illustrating a process for forming grid lines in a substrate wafer at which semiconductor devices relating to the present invention are formed collectively.

The layered body (11, 12, 13, 14) at which the internal electrode pads 15 and the electrode pads 16 for the substrate are formed, is formed, in accordance with a conventionally known method for manufacturing a semiconductor, collectively on a wafer 11A formed from a single silicon substrate as shown in FIG. 3.

As a pre-processing for separating the wafer 11A into the respective IC chips 10, cut grooves 18, which extend to the silicon substrate 11 from the surface oxide film 14 via the silicon crystal layer 13 and the insulating layer 12, are formed on the wafer 11A.

The cut grooves 18 are formed in a lattice-like configuration along the borders of the respective IC chips 10, and are called grid lines.

Figure 4:
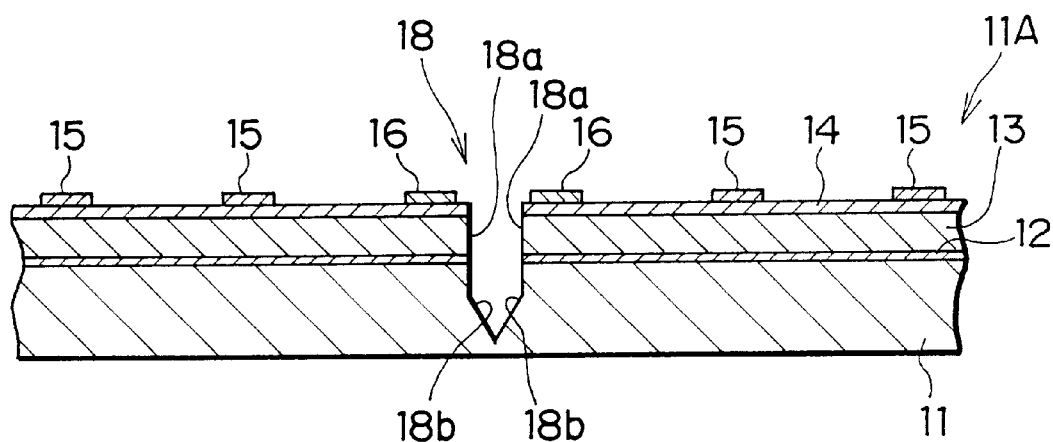
FIG. 4 is a partially-broken cross-sectional view of the substrate wafer illustrated in FIG. 3.

As shown in FIG. 4, the grid line, i.e., the cut groove 18, is defined, between electrode pads 16 for the substrate of two adjacent IC chips 10, by a pair of side wall surfaces 18a which are spaced apart from each other and extend downward, and inclined bottom wall surfaces 18b which extend downwardly from the bottom ends of the side wall surfaces and converge together. The inclined bottom wall surfaces 18b do not extend to the bottom surface of the silicon substrate 11, and rather, converge at a position which is a slight distance away from the bottom surface of the silicon substrate 11. Thus, the wafer 11A is in a half-cut state such that a thin thickness of the substrate 11 remains beneath the cut grooves 18.

These cut grooves 18 are formed by using, for example, a conventionally known scriber having a diamond cutter.

After the cut grooves 18 are formed, a conductive, paste-like metal material, such as a solder paste or a silver paste, is applied to regions extending from the wall surfaces 18a and 18b of the groove to the electrode pads 16 for the substrate.

The paste material is subjected to an appropriate heating processing and thereby hardens. The conductive layer 17 connecting the electrode pads 16 for the substrate and the silicon substrate 11 is formed continuously for each of the adjacent IC chips 10.

After the conductive layer 17 is formed, the wafer 11A is separated into the respective chips 10 along the cut grooves 18. As the wafer 11A is separated, the conductive layers 17 which are integral with the respective chips 10 are separated.

In accordance with the method relating to the present invention, the cut grooves, which are grid lines for separating the respective IC chips and which are used in conventional methods for manufacturing semiconductors, are used as described above. Thus, a large number of IC chips, to which a substrate potential can be applied from the IC chip surface, can be efficiently formed without forming special etched holes for connecting the electrode pads 16 for the substrate and the silicon substrate 11, and without an etching process for forming the etched holes.

Figure 6:
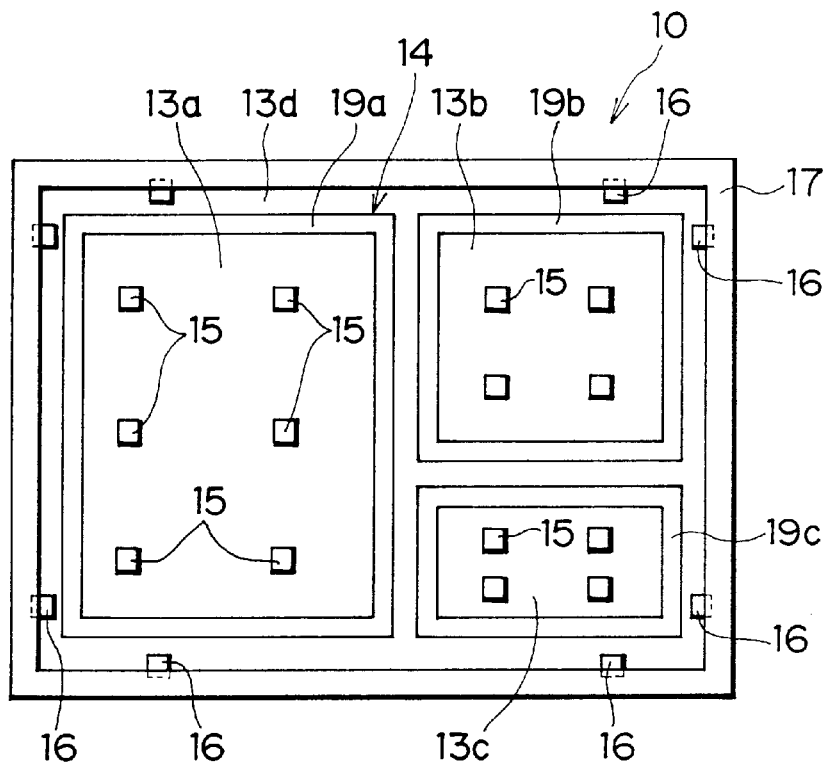
FIG. 6 is a plan view which is similar to FIG. 1 and illustrates another semiconductor device relating to the present invention.
Figure 7:
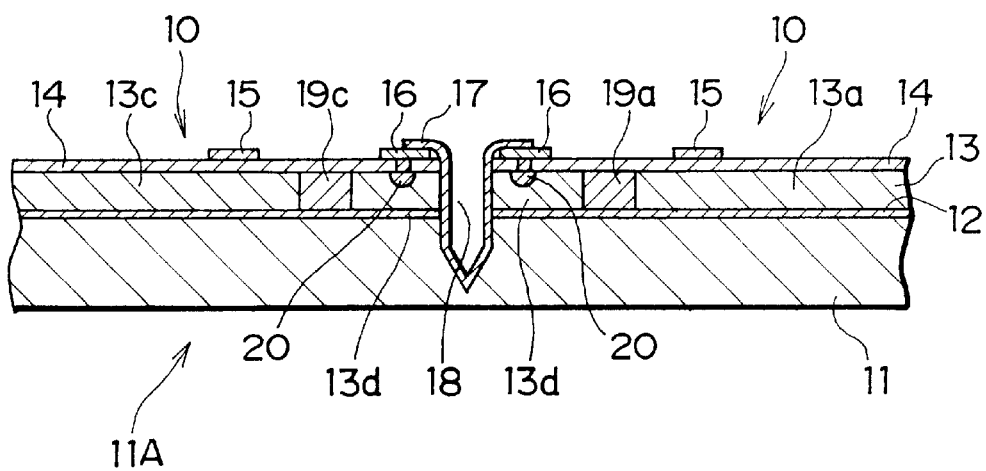
FIG. 7 is a cross-sectional view which is similar to FIG. 5 and illustrates a process for manufacturing the semiconductor device illustrated in FIG. 6.

FIGS. 6 and 7 illustrate another semiconductor IC chip 10 relating to the present invention, and a method of manufacturing the same.

Figure 5:
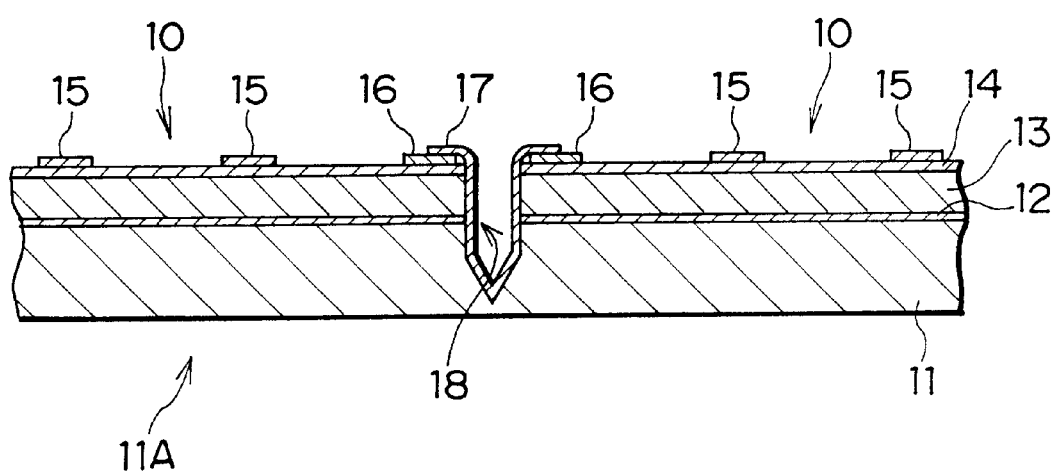
FIG. 5 is a cross-sectional view which is similar to FIG. 4 and illustrates a process for forming a conductive layer in the substrate wafer illustrated in FIG. 3.

In the same way as the IC chip 10 illustrated in FIG. 1, the IC chip 10 illustrated in FIG. 6 has an SOI structure which is a layered structure formed from the silicon substrate 11, the insulating layer 12, the silicon crystal layer 13 and the surface oxide film 14, and the method of manufacturing thereof illustrated in FIG. 7 is basically the same as the method illustrated in FIG. 5.

In the IC chip 10 illustrated in FIG. 6, the silicon crystal layer 13 in which the electronic circuit is built-in is electrically isolated on the insulating layer 12 by three insulating bands 19a, 19b, 19c which are silicon oxide film layers formed by, for example, LOCOS or STI (shallow trench isolation). In this way, the silicon crystal layer 13 in which the electronic circuit is built-in is divided into circuit blocks 13a, 13b, 13c, and a peripheral portion 13d which surrounds these circuit blocks.

The three circuit blocks 13a, 13b, 13c are for exclusive use for, for example, an analog circuit/digital circuit or a high speed operation circuit/low speed operation circuit, and these electronic circuits are built therein appropriately by conventionally known methods. Further, at the circuit blocks 13a, 13b, 13c, the internal electrode pads 15 for the electronic circuits, such as those described above which are conventionally known, are provided on the surface oxide film 14.

Further, a large number of electrode pads 16 for the substrate are arranged on the surface oxide film 14 at the peripheral portion of the silicon substrate 11 which surrounds all of the circuit blocks 13a, 13b, 13c. The conductive layer 17 which connects the electrode pads 16 for the substrate is formed so as to surround the peripheral portion of the silicon substrate 11.

In the IC chip illustrated in FIG. 6, as is shown in FIG. 7 which illustrates the method of manufacturing thereof, the electrode pad 16 for the substrate is reliably electrically connected to the peripheral portion 13d of the silicon crystal layer 13 via a diffusion layer portion 20 which penetrates from the electrode pad 16 for the substrate through the surface oxide film 14 and extends into the peripheral portion 13d of the silicon crystal layer 13.

Similarly to the example described above, the electrode pads 16 for the substrate are electrically connected to the silicon substrate 11 via the conductive layer 17 which surrounds the peripheral sides of the IC chip 10.

Accordingly, by applying a predetermined potential to the electrode pads 16 for the substrate which are provided on the surface of the IC chip 10, the peripheral portion 13d of the silicon crystal layer 13 can be reliably maintained at a predetermined potential in accordance with the silicon substrate 11. The application of potential to the peripheral portion 13d is effective in improving the anti-noise characteristic, as is known conventionally.

As shown in FIG. 7 which is similar to FIG. 5, the conductive layer 17, which electrically connects the silicon substrate 11 to the electrode pads 16 for the substrate which are connected to the peripheral portion 13d via the diffusion layer portions 20, is formed in the cut grooves 18 which extend to the silicon substrate 11 and are for separating the large number of IC chips 10 which are collectively formed on the wafer 11A which is similar to that described above. Namely, the conductive layer 17 is formed on the groove surfaces 18a and 18b. After the conductive layer 17 is formed, the wafer 11A is separated into the respective IC chips 10.

Figure 8:
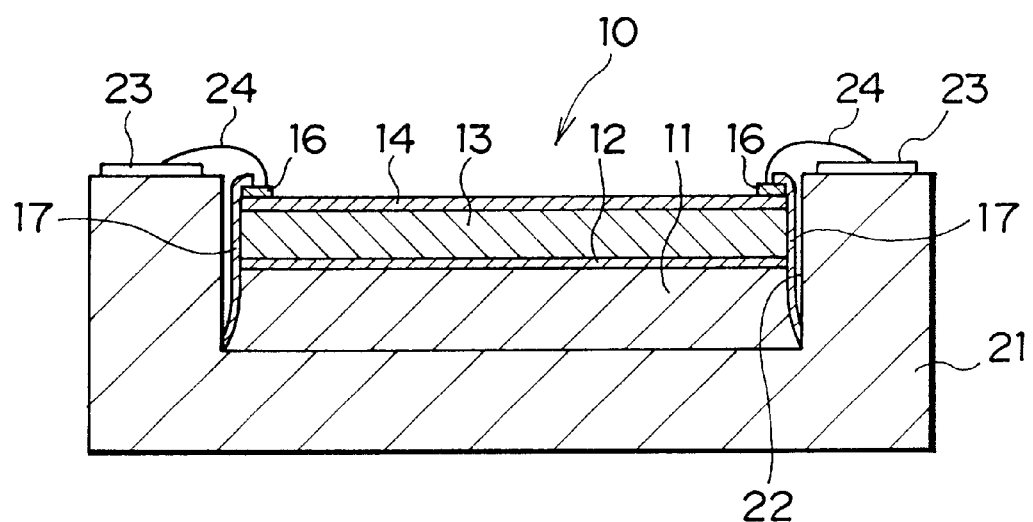
FIG. 8 is a cross-sectional view illustrating an example of packaging of the semiconductor device relating to the present invention.

FIG. 8 illustrates an example of packaging the IC chip 10.

In a recess 22 (i.e., a cavity) of a package body 21 which is formed from, for example, a mold or from ceramics and whose one end surface is open, the IC chip 10 is accommodated such that the upper surface thereof, at which the electrode pads 16 of the substrate are provided, is positioned at the open end surface side of the recess 22. Package electrodes 23 for electrical connection with the electrode pads 16 for the substrate are provided at the edge portion of the package body 21 which surrounds the recess 22 of the package body 21. Although the internal portion electrode pads 15 are not illustrated in FIG. 8 for the sake of convenience of illustration, package electrodes (not shown) for electrical connection with the internal portion electrode pads 15 are also provided at the edge portion of the package body 21.

The electrode pad 16 for the substrate, which is electrically connected to the silicon substrate 11 via the conductive layer 17, is connected via a bonding wire 24 to the package electrode 23 which is positioned at the edge portion of the package body 21 at the same side of the package at which the electrode pad 16 for the substrate is provided.

Accordingly, in accordance with the package illustrated in FIG. 8, a conductive path which passes through the wall surface of the recess 22 of the package body 21 is not formed as in the conventional art in order to apply potential to the silicon substrate 11 of the IC chip 10. By applying potential to the package electrodes 23, a predetermined potential can be applied to the silicon substrate 11 of the IC chip 10.

The electrode pad 16 for the substrate and the package electrode 23 connected thereto are positioned on the same side of the package. Therefore, the bonding wire 24 connecting the electrode pad 16 for the substrate and to the package electrode 23 can be provided compactly and does not have to be disposed in the interior of the recess 22. Thus, the package can be made compact on the whole, and the manufacturing process does not become complex as compared to the conventional art.

Figure 9:
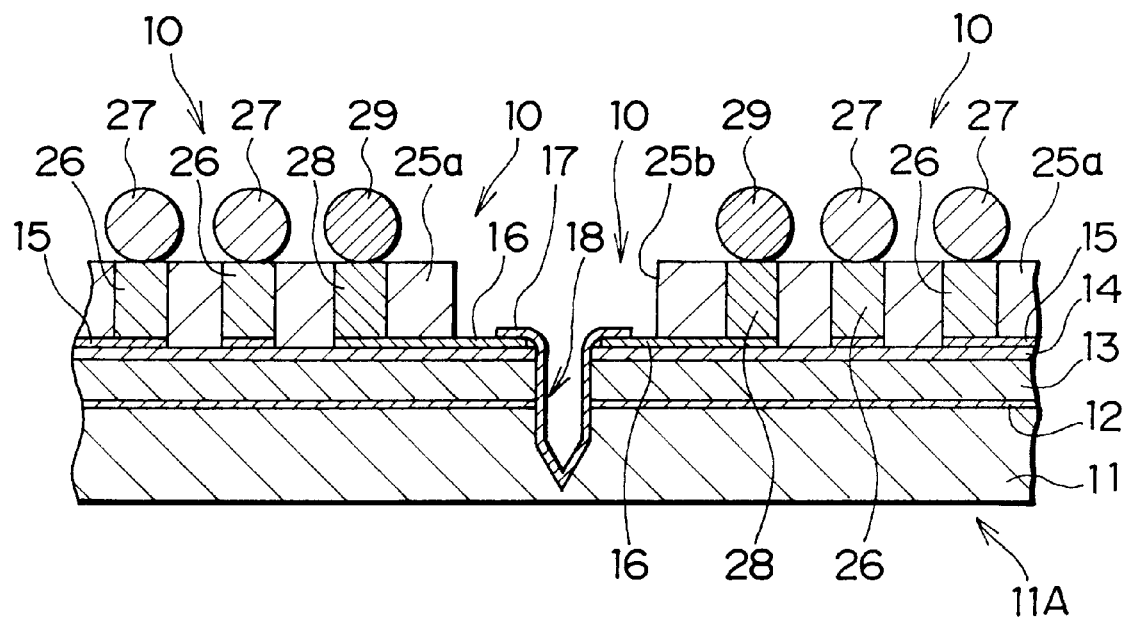
FIG. 9 is a cross-sectional view illustrating a manufacturing process in a case in which the method of manufacturing a semiconductor device relating to the present invention is applied to a CSP, which is another example of packaging using a package plate.
Figure 10:
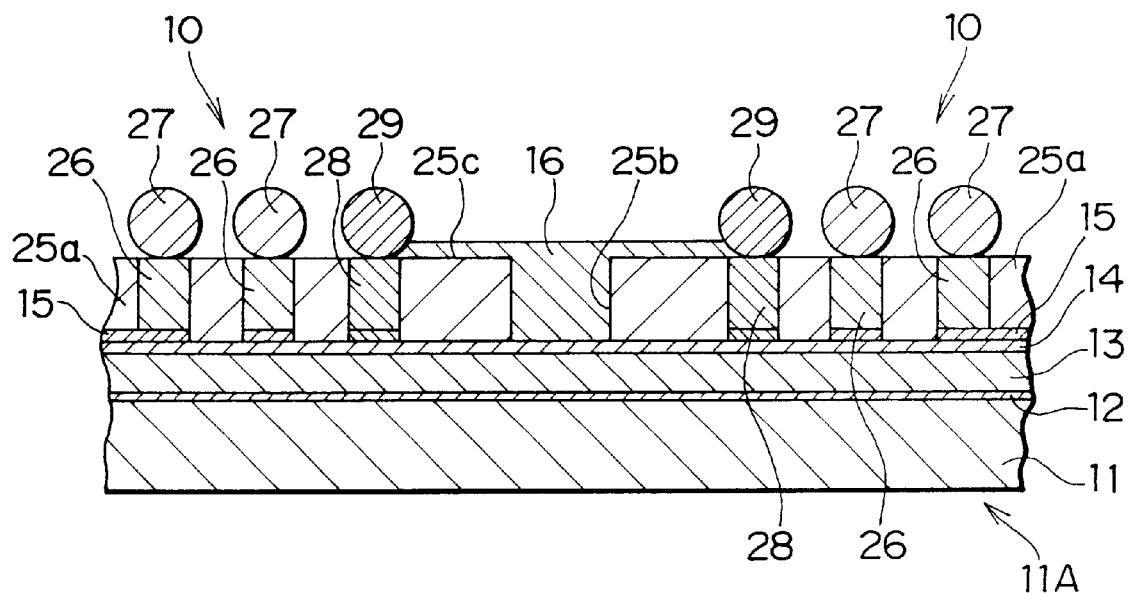
FIG. 10 is a cross-sectional view illustrating a process of arranging a package plate and showing another example of a package plate utilized in a CSP relating to the present invention.

FIGS. 9 and 10 illustrate an example in which the present invention is applied to a CSP.

FIG. 9 is a view, similar to FIGS. 5 and 7, which illustrates a method of manufacturing a CSP.

An insulating plate 25, which is formed from a polyimide resin material or the like, is joined, so as to face the surfaces of the IC chips 10, to the wafer 11A having the laminated structure in which the silicon substrate 11, the insulating layer 12, the silicon crystal layer 13 and the surface oxide film 14 are formed. Package plate portions 25a corresponding to the respective IC chips 10 are formed continuously at the insulating plate 25.

Slots 25b are formed in the insulating plate 25. The slots 25b extend along the borders of the IC chips 10 and are for demarcating the package plate portions 25a corresponding to the IC chips 10. Conductive portions 26 and balls 27 are formed at each of the package plate portions 25a demarcated by the slots 25b. The conductive portions 26 are connected to the internal portion electrode pads 15 of the corresponding IC chip 10, and penetrate through the insulating plate 25 in the direction of the plate thickness thereof. The balls 27 are connection terminals which are connected to the conductive portion and are provided on the surface of the insulating plate 25.

In a vicinity of the slot 25b of the package plate portion 25a, the electrode pad 16 for electrical connection to the substrate 11 of the IC chip 10 extends on the surface oxide film 14 of the IC chip 10.

The electrode pad 16 for the substrate is connected to a ball 29 via a conductive portion 28 which passes through the package plate portion 25a. In the same way as the balls 27, the balls 29 are connection terminals which are aligned on the surface of the insulating plate 25.

After the insulating plate 25 and the wafer 11A have been joined, the cut grooves 18 are formed, in the same way as described above, along the slots 25b. Thereafter, the conductive layer 17, which electrically connects the electrode pads 16 for the substrate and the silicon substrate 11, is formed along the groove surfaces of the cut grooves 18 as described previously. After the conductive layer 17 has been formed, the wafer 11A is separated into the respective chips 10 along the cut grooves 18. The respective conductive layers 17 are divided together with the chips 10, so as to obtain the respective IC chips 10 having CSP structures.

Instead of forming the slots 25b in the insulating plate 25 as described above, as shown in FIG. 10, the electrode pads 16 for the substrate can be formed by filling in the portions corresponding to the slots 25b with a conductive material. The electrode pad 16 for a substrate is connected to the ball 29 via a conductive portion 25c which extends toward the ball 29 at the surface of the insulating plate 25.

In this example, the conductive portion 28 does not serve as a conductor, but rather, functions as a holding portion for holding the ball 29.

Figure 11:
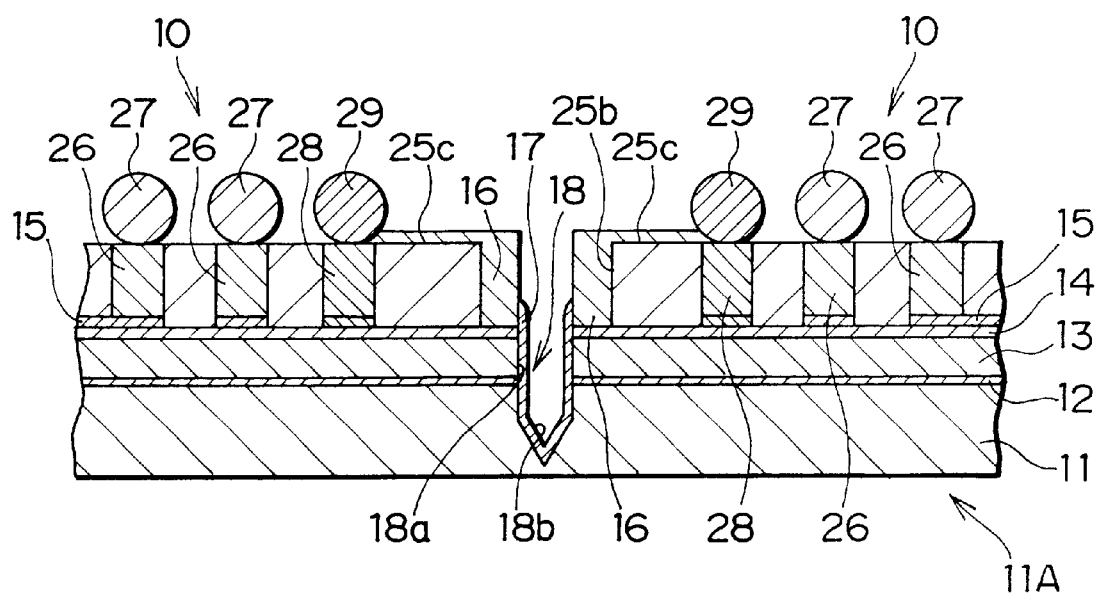
FIG. 11 is a cross-sectional view illustrating respective processes for forming cut grooves and a conductive layer in the CSP shown in FIG. 10.

The insulating plate 25, in which the slots 25b are filled in with the electrode pad 16 for the substrate, is joined to predetermined portions of the wafer 11A as shown in FIG. 10. Thereafter, the cut grooves 18 such as those described previously are formed from the insulating plate 25 side toward the silicon substrate 11. As shown in FIG. 11, the cut grooves 18 extend to the silicon substrate 11 so as to divide the electrode pads 16 for the substrate which fill in the slots 25b.

After the cut grooves 18 are formed, the conductive layer 17 similar to that described previously is formed in at the groove surfaces. The conductive layer 17 extends to the electrode pads 16 for the substrate, via the groove surfaces 18a and 18b of the cut grooves 18. Therefore, the silicon substrate 11 is electrically connected to the ball 29 which is connected to the pad 16 via the conductive portion 25c.

After the conductive layer 17 has been formed, in the same way as was explained with reference to FIG. 9, the wafer 11A is divided into the respective chips 10 along the cut grooves 18. As the wafer 11A is divided, the conductive layers 17 are divided together with the respective chips 10, so as to obtain the IC chips 10 with CSP structures.

The above describes examples in which the conductive layer 17 surrounds the peripheral surfaces of the IC chip 10 continuously along the peripheral direction thereof. However, alternatively, the conductive layer 17 can be formed at portions in the peripheral direction of the IC chip 10, i.e., can be formed non-continuously (intermittently).

However, in order to obtain a reliable and good electrical connection between the silicon substrate 11 and the electrode pads 16 for the substrate and in order to increase the mechanical strength of the IC chip 10, it is preferable to form the conductive layer 17 continuously in the peripheral direction of the IC chip 10.

The above describes the present invention in terms of a semiconductor IC device having an SOI structure and a method of manufacturing the same. However, the present invention is not limited to the same, and may be applied to a CMOS-LSI semiconductor device having a well portion which is a region electrically isolated from the substrate, and a method of manufacturing the same. Or, the present invention may be applied to a dielectric isolated type LSI semiconductor device having a region which is electrically isolated from the substrate by a dielectric, and a method of manufacturing the same.

In accordance with the present invention, as described above, there is no need to subject the inner portions of the chip to etching processing in order to form a conductive layer which electrically connects the chip substrate and the electrode pads for the substrate. Further, the conductive layer can be formed at the groove surfaces of cut grooves by utilizing the cut grooves which are provided in order to separate the chips. Thus, the conductive layer is electrically connected to the substrate at the peripheral surfaces of the substrate without making the IC chip less compact. Therefore, a desired potential can be reliably and stably applied to the substrate.

Accordingly, in accordance with the method of the present invention, a semiconductor device, in which a stable substrate potential can be ensured without adversely affecting compactness, can be manufactured relatively easily.

In accordance with the present invention, a conductive layer which is formed so as to surround the side surfaces of the substrate is used. Thus, the substrate and the electrode pads formed on the surface oxide film covering the substrate can be electrically connected well without using conductive plugs which extend within the IC chip and without using bonding wires which protrude outwardly of the chip by a large amount. Thus, the present invention provides a compact semiconductor device which exhibits stable operation due to a stable substrate potential being maintained.

What is claimed is:

1. A method of manufacturing a semiconductor device comprising the steps of:

forming cut grooves in a wafer which becomes a substrate, the wafer including a semiconductor layer which is disposed on the wafer via an insulating layer and at which a plurality of same semiconductor circuits are formed collectively, a surface oxide film which covers the semiconductor layer, and electrode pads for electrical contact with the substrate, the electrode pads being formed on the surface oxide film in correspondence with the respective semiconductor circuits, the cut grooves being formed in the wafer from the surface oxide film to the substrate, for separating the wafer into chips of the respective semiconductor circuits; and before separating the wafer into the chips, forming a conductive layer on groove surfaces of the cut grooves, the conductive layer extending from a substrate region via the groove surfaces of the cut grooves to the electrode pads.

2. A method of manufacturing a semiconductor device according to claim 1, wherein the cut grooves are grid lines disposed in a lattice configuration.

3. A method of manufacturing a semiconductor device according to claim 1, wherein the conductive layer is formed by heating after a paste-like conductive material which hardens by heating is applied to predetermined places including the groove surfaces of the cut grooves.

4. A method of manufacturing a semiconductor device according to claim 1, wherein the wafer is formed from silicon oxide and, together with the insulating layer and the semiconductor layer, forms an SOI structure.

* * * * *